United States Patent
Boivin

(10) Patent No.: US 9,941,390 B2
(45) Date of Patent: Apr. 10, 2018

(54) METHOD OF FABRICATING A VERTICAL MOS TRANSISTOR

(71) Applicant: STMicroelectronics (Rousset) SAS, Rousset (FR)

(72) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 37 days.

(21) Appl. No.: 14/946,408

(22) Filed: Nov. 19, 2015

(65) Prior Publication Data

US 2016/0079391 A1 Mar. 17, 2016

Related U.S. Application Data

(62) Division of application No. 14/150,592, filed on Jan. 8, 2014, now Pat. No. 9,196,654.

(30) Foreign Application Priority Data

Jan. 8, 2013 (FR) ...................................... 13 50134

(51) Int. Cl.
*H01L 29/66* (2006.01)
*H01L 27/24* (2006.01)
(Continued)

(52) U.S. Cl.
CPC .... *H01L 29/66666* (2013.01); *H01L 21/0262* (2013.01); *H01L 21/02532* (2013.01); *H01L 21/02595* (2013.01); *H01L 21/2253* (2013.01); *H01L 21/2257* (2013.01); *H01L 21/28273* (2013.01); *H01L 21/28282* (2013.01); *H01L 27/2454* (2013.01); *H01L 29/66825* (2013.01); *H01L 29/66833* (2013.01); *H01L 29/7827* (2013.01); *H01L 29/7883* (2013.01); *H01L 29/7889* (2013.01); *H01L 29/7926* (2013.01);
(Continued)

(58) Field of Classification Search
None
See application file for complete search history.

(56) References Cited

U.S. PATENT DOCUMENTS 5,208,172 A * 5/1993 Fitch ............... H01L 21/823487
257/E21.41
5,385,853 A * 1/1995 Mohammad ...... H01L 29/66666
257/330

(Continued)

*Primary Examiner* — Tom Thomas
*Assistant Examiner* — Steven B Gauthier
(74) *Attorney, Agent, or Firm* — Seed IP Law Group LLP

(57) ABSTRACT

The disclosure relates to a method of fabricating a vertical MOS transistor, comprising the steps of: forming, above a semiconductor surface, a conductive layer in at least one dielectric layer; etching a hole through at least the conductive layer, the hole exposing an inner lateral edge of the conductive layer and a portion of the semiconductor surface; forming a gate oxide on the inner lateral edge of the conductive layer and a bottom oxide on the portion of the semiconductor surface; forming an etch-protection sidewall on the lateral edge of the hole, the sidewall covering the gate oxide and an outer region of the bottom oxide, leaving an inner region of the bottom oxide exposed; etching the exposed inner region of the bottom oxide until the semiconductor surface is reached; and depositing a semiconductor material in the hole.

17 Claims, 3 Drawing Sheets

(51) Int. Cl.
*H01L 29/792* (2006.01)
*H01L 21/225* (2006.01)
*H01L 29/78* (2006.01)
*H01L 29/788* (2006.01)
*H01L 21/02* (2006.01)
*H01L 21/28* (2006.01)
H01L 29/06 (2006.01)
H01L 27/108 (2006.01)

(52) U.S. Cl.
CPC .... *H01L 27/10876* (2013.01); *H01L 29/0676* (2013.01)

(56) References Cited

U.S. PATENT DOCUMENTS

| | | | | |
|---|---|---|---|---|
| 6,011,288 | A * | 1/2000 | Lin | H01L 27/115 257/315 |
| 6,060,746 | A * | 5/2000 | Bertin | H01L 29/7827 257/331 |
| 6,187,649 | B1 * | 2/2001 | Gau | H01L 21/76224 257/221 |
| 2011/0199813 | A1 | 8/2011 | Yoo et al. | |
| 2011/0297911 | A1 | 12/2011 | Shima et al. | |

* cited by examiner

METHOD OF FABRICATING A VERTICAL MOS TRANSISTOR

BACKGROUND

Technical Field

The present disclosure relates to a method of fabricating a vertical MOS transistor, and a transistor fabricated thereby. The disclosure also relates to a memory cell comprising such a transistor.

Description of the Related Art

Integrated circuits have traditionally been fabricated with planar transistors. However, vertical transistors are becoming more common, as they allow smaller transistor sizes and can more easily be stacked, for example for stacked memory cell applications.

FIGS. 1A and 1B are cross-sectional views showing conventional steps of fabrication of a vertical transistor. FIG. 1A shows a step S1, wherein a semiconductor substrate 1 comprising a doped region 2 serves as a base for a vertical transistor structure. Dielectric layers 3 (3-1, 3-2, 3-3) are deposited on the top surface of the substrate, and a conductive layer 4 comprising outer lateral edges 4' is formed in the dielectric layer 3-2. A hole 5 is then etched through the dielectric layers 3 and the conductive layer 4, exposing an inner lateral edge 4" of the conductive layer and a portion 1' of the top surface of the substrate.

FIG. 1B shows a step S2, wherein a thermal oxidation is performed. A gate oxide 6 forms on the inner lateral edge 4" of the conductive layer and a bottom oxide 7 also forms on the portion 1' of the top surface of the substrate. A semiconductor material may then be deposited in the hole 5, forming a vertical MOS ("metal-oxide-semiconductor") transistor.

Nevertheless, unless removed beforehand, the bottom oxide 7 prevents electrical contact between the semiconductor material in the hole and the doped region 2. Therefore, the bottom oxide 7 may be etched, such as by means of a reactive ion etch process, but the gate oxide 6 may be damaged in the etching process. An alternative is to form a cavity below the transistor structure, filled with a "sacrificial material", such as nitride, that does not oxidize and may then be removed by means of a wet etch process. The cavity can then be re-filled with a semiconductor material. Nevertheless, the chemical used for etching may contaminate the surfaces of the transistor, and the small diameter and total depth of the hole 5 limit the access to the cavity for etching and refilling.

It may therefore be beneficial to provide an alternative method of fabricating a vertical transistor.

BRIEF SUMMARY

Embodiments of the disclosure relate to a method of fabricating a vertical MOS transistor, comprising the steps of: forming, above a semiconductor surface, a conductive layer in at least one dielectric layer; etching a hole through at least the conductive layer, the hole exposing an inner lateral edge of the conductive layer and a portion of the semiconductor surface; forming a gate oxide on the inner lateral edge of the conductive layer and a bottom oxide on the portion of the semiconductor surface; forming an etch-protection sidewall on the lateral edge of the hole, the sidewall covering the gate oxide and an outer region of the bottom oxide, leaving an inner region of the bottom oxide exposed; etching the exposed inner region of the bottom oxide until the semiconductor surface is reached; and depositing a semiconductor material in the hole.

According to one embodiment, the method further comprises a step of forming, in the semiconductor surface, a doped region comprising dopants of a first conductivity type.

According to one embodiment, the method further comprises a step of diffusing the dopants from the doped region into the semiconductor material in the hole to form a conduction terminal of the transistor.

According to one embodiment, the etch-protection sidewall is a semiconductor material, and the method comprises a step of doping the etch-protection sidewall with dopants of a second conductivity type.

According to one embodiment, the method further comprises the steps of: implanting dopants of a first conductivity type into the top surface of the semiconductor material; and diffusing the dopants into the hole to form a conduction terminal of the transistor.

According to one embodiment, the method further comprises, after forming the gate oxide, the steps of: forming a charge storage layer covering the gate oxide; and forming a tunnel oxide layer covering the charge storage layer.

Embodiments of the disclosure also relate to a transistor comprising: a conductive layer formed in at least one dielectric layer above a semiconductor surface; a hole traversing at least the conductive layer and exposing an inner lateral edge of the conductive layer and a portion of the semiconductor surface; a gate oxide formed on the inner lateral edge of the conductive layer; and a semiconductor material in the hole. The transistor further comprises an etch-protection sidewall on the lateral edge of the hole, between the gate oxide and the semiconductor material; and an outer region of a bottom oxide formed between the bottom of the etch-protection sidewall and the semiconductor surface.

According to one embodiment, the transistor further comprises a region in the semiconductor surface comprising dopants of a first conductivity type.

According to one embodiment, the etch-protection sidewall is a semiconductor material comprising dopants of a second conductivity type.

According to one embodiment, the transistor further comprises a charge storage layer and a tunnel oxide layer between the gate oxide and the etch-protection sidewall.

Embodiments of the disclosure also relate to a memory cell comprising a data storage element and a selection transistor according to one embodiment of the disclosure.

According to one embodiment, the data storage element is a transistor according to one embodiment of the disclosure.

Embodiments of the disclosure also relate to an array of memory cells according to one embodiment of the disclosure.

Embodiments of the disclosure also relate a device comprising an integrated circuit comprising a transistor according to one embodiment of the disclosure.

BRIEF DESCRIPTION OF THE SEVERAL VIEWS OF THE DRAWINGS

Embodiments of the present disclosure will now be described in connection with, but not limited to, the appended drawings in which.

DETAILED DESCRIPTION

FIGS. 1A, 1B, and FIGS. 2A to 2F show steps of a method of fabricating a vertical MOS transistor T1 according to one embodiment of the disclosure. It should be noted that for ease of description, the steps are described below in relation with the fabrication of an NMOS transistor, but are equally applicable to the fabrication of a PMOS transistor. Furthermore, though already described in the preamble, in relation with FIGS. 1A, 1B, steps S1, S2 will be described again in further detail.

Figure 1A:
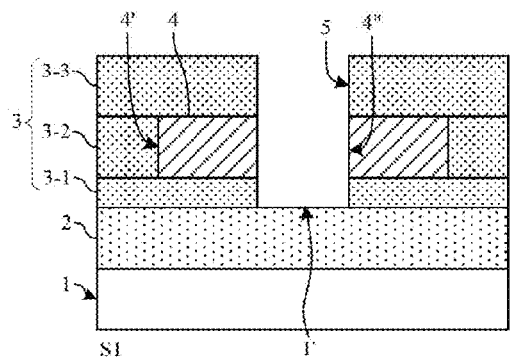
FIGS. 1A and 1B, previously described, show first steps of a conventional method of fabricating a vertical transistor.

FIG. 1A shows a step S1, wherein a P-conductivity type semiconductor substrate 1 is doped with N-conductivity type dopants to form a doped region 2. A dielectric layer 3-1 is then formed on the surface of the substrate 1 by means of a thermal oxidation and "TEOS" (Tetra-ethyl-ortho-silicate) process. A conductive layer 4, such as polycrystalline silicon or "polysilicon", comprising etched outer lateral edges 4', is then formed in a second dielectric layer 3-2. Finally, a third dielectric layer 3-3 is formed above the second dielectric layer 3-2, again by a thermal oxidation and a TEOS capping process. A hole 5 is then etched through the dielectric layers 3 and the conductive layer 4. This step is performed in a conventional manner, for example by depositing and patterning an etching mask (not shown), which is then removed. The etching of the hole 5 defines an inner lateral edge 4" of the conductive layer 4 and exposes a portion 1' of the top surface of the substrate 1. Optionally, an N+ conductivity type gate implantation of the inner lateral edge 4" and of the top surface of the substrate 1 is performed at this time. Such an implantation allows the threshold voltage of the eventual transistor to be stabilized, as well as more heavily doping the region 2 in the area underlying the hole.

Figure 1B:
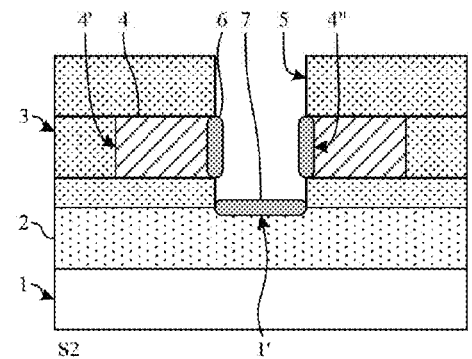

FIG. 1B shows a step S2, wherein a thermal oxidation is performed, forming a gate oxide 6 on the inner lateral edge 4" of the conductive layer, and a bottom oxide 7 on the portion 1' of the substrate surface 1.

Figure 2A:
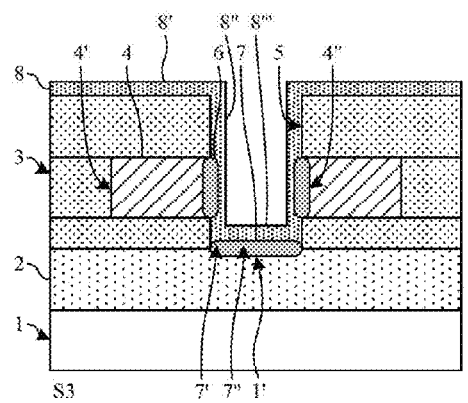
FIGS. 2A to 2F show steps of a method of fabricating a vertical transistor according to one embodiment of the disclosure.

FIG. 2A shows a step S3, wherein an etch-protection layer 8 is deposited in a conformal manner. The layer 8 comprises: a first lateral portion 8' covering the top surface of the third dielectric layer 3-3; a vertical portion 8'" covering the lateral edge of the hole 5, the gate oxide 6, and an outer region 7' of the bottom oxide 7; and a third lateral portion 8'" covering an inner region 7" of the bottom oxide 7. The etch-protection layer 8 is for example a thin semiconductor layer, such as polysilicon, deposited by means of chemical vapor deposition. A channel doping implant of P-conductivity type dopants is then performed of the etch-protection layer 8. An optional thermal treatment may then be performed.

Figure 2B:
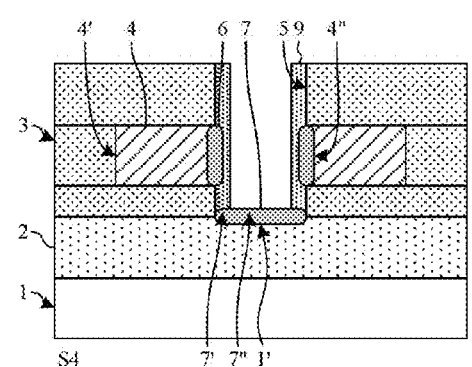

FIG. 2B shows a step S4, wherein a dry anisotropic etch is performed of the etch-protection layer 8, removing the portion 8' covering the top surface of the dielectric layer 3-3 and the portion 8'" covering the inner region 7" of the bottom oxide 7. The vertical portion 8" remains as an etch-protection sidewall 9, covering the lateral edge of the hole, the gate oxide 6, and the outer region 7' of the bottom oxide. The inner region 7" of the bottom oxide 7 is thus exposed.

Figure 2C:
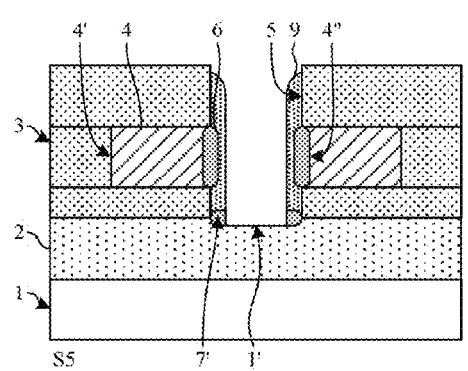

FIG. 2C shows a step S5, wherein a dry oxide etch is performed of the bottom oxide 7. The exposed inner region 7" of the bottom oxide is etched until the top surface of the substrate 1 is again exposed. The gate oxide 6 and the outer region 7' of the bottom oxide are not etched due to the presence of the sidewall 9, which may be slightly etched on its top edges.

Figure 2D:
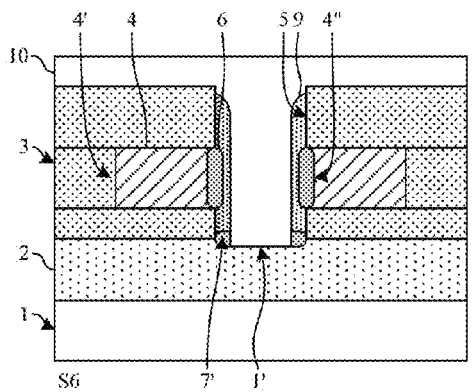

FIG. 2D shows a step S6, wherein a semiconductor material 10, such as lightly P-doped polycrystalline silicon, is deposited in the hole by means of a High Temperature Film process. The semiconductor material 10 fills the region between the etch-protection sidewall 9 and makes electrical contact with the doped region 2 of the semiconductor substrate 1.

Figures 2E, 2F:
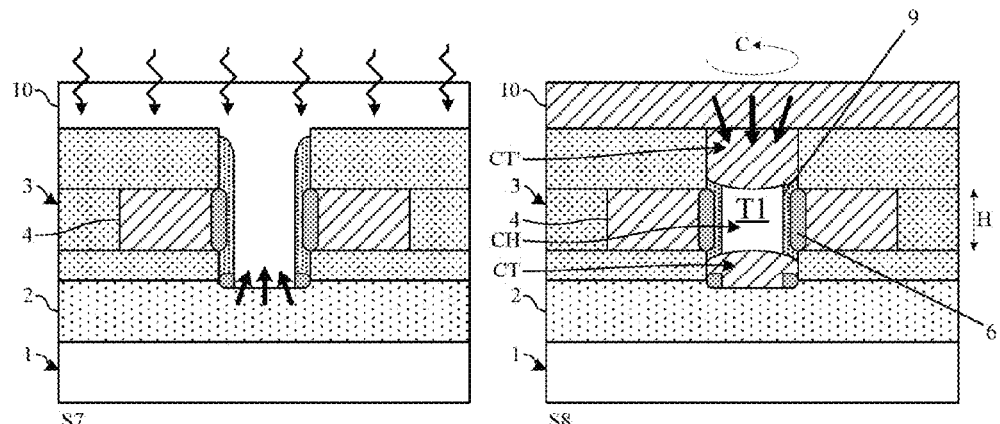

FIG. 2E shows a step S7, wherein a thermal diffusion is performed. The N-type dopants in the doped region 2 diffuse vertically upward into the bottom portion of the semiconductor material 10 in the hole, forming a first conduction terminal CT (source, drain) of the transistor. The P-type dopants in the etch-protection sidewall may slightly diffuse as well. N-type dopants are then implanted into the top surface of the semiconductor material 10.

FIG. 2F shows a step S8, wherein another thermal diffusion is performed. The N-type dopants implanted in the top surface of the semiconductor material 10 diffuse vertically downward into the semiconductor material in the hole 5, forming a second conduction terminal CT' (drain, source) of the transistor. The transistor T1 thus comprises N-doped conduction terminals CT, CT' on each side of a P-doped channel CH, which comprises the P-doped semiconductor material 10 and the P-doped etch-protection sidewall 9. The junctions between the P-doped channel and the edges of the conduction terminals CT, CT' are approximately at the bottom and top edges respectively of the gate oxide 6.

As may be seen in FIG. 2F, the diffusion of dopants from the doped region 2 into the semiconductor material 10 has created a conduction terminal CT with a sort of "mushroom" shape, wherein the lateral edges of the terminal have counter-doped the bottom portion of the P-doped sidewall 9 and the lightly P-doped material 10 in the hole. Likewise, the diffusion of dopants from the top surface has created a conduction terminal CT' wherein the lateral edges of the terminal have counter-doped the top portion of the P-doped sidewall 9 and the lightly P-doped material 10 in the hole.

The conductive layer 4 forms a gate and is separated from the channel CH by means of the gate oxide 6. The transistor T1 has a channel width equal to the circumference C of the hole, and a channel length equal to the height H of the gate oxide 6. The vertical MOS transistor T1, T1' thus has a larger channel width (the circumference or perimeter of the hole 5) than a traditional planar transistor. Consequently, the transistor T1 allows a higher amount of current to flow, for example between 10 and 100 µA, which is desirable in memory cell applications such as resistive memory (RRAM) and phase change memory (PCRAM).

As a numerical example, the dielectric layers 3-1, 3-2, 3-3 have thicknesses of 50 nm, 100 nm, 100 nm respectively. The conductive layer has a width of 100 nm. The hole 5 has a diameter between 65 and 200 nm, and a total depth of 250 nm. The gate oxide 6 and the bottom oxide 7 have thicknesses of 2 to 3 nm. The etch-protection layer 8 and etch-protection sidewall 9 have thicknesses of 15 nm.

Figures 3, 7:
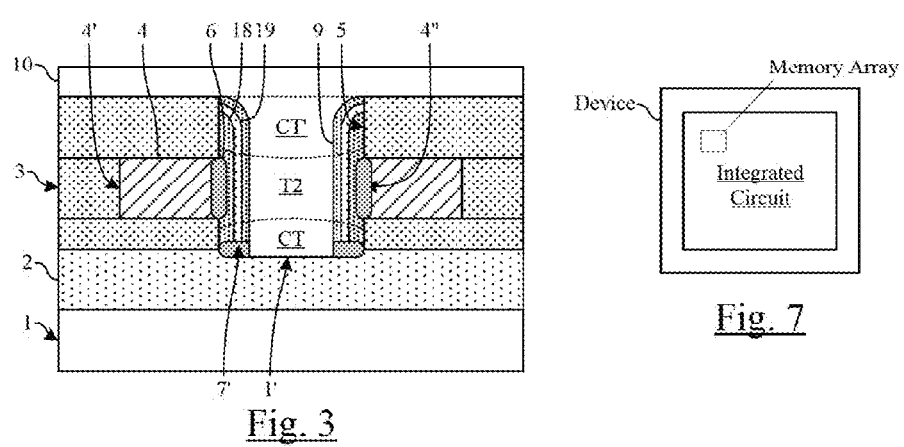
FIG. 3 shows a transistor according to another embodiment of the disclosure.
FIG. 7 shows a device comprising an integrated circuit according to one embodiment of the disclosure.

FIG. 3 shows a cross-sectional view of a transistor T2 according to another embodiment of the disclosure. Transistor T2 is of the charge-storage or "floating-gate" type. For the sake of clarity, the conduction terminals CT, CT' are shown in outline only. With respect to transistor T1, transistor T2 further comprises a charge storage layer 18 and a tunnel oxide layer 19 interposed between the gate oxide 6 and the etch-protection sidewall 9. The charge storage layer 18 is for example a thin semiconductor layer, such as polysilicon, a nitride layer, or a layer comprising nanocrystals such as silicon dots. The oxide layer 19 is for example an Interpoly Dielectric (IPD). The charge storage layer 18 and tunnel oxide layer 19 may be successively deposited and etched in a selective manner.

The outer region 7' of the bottom oxide is interposed between the bottom edges of the charge storage layer 18, the tunnel oxide layer 19, and the etch-protection sidewall 9, and the top surface of the substrate 1. It may be noted that in this embodiment, the etch-protection sidewall 9 does not directly cover the gate oxide 6, but may be understood as intervening between the semiconductor material 10 and the gate oxide 6, and still covering the outer region 7' of the bottom oxide.

Figure 4:
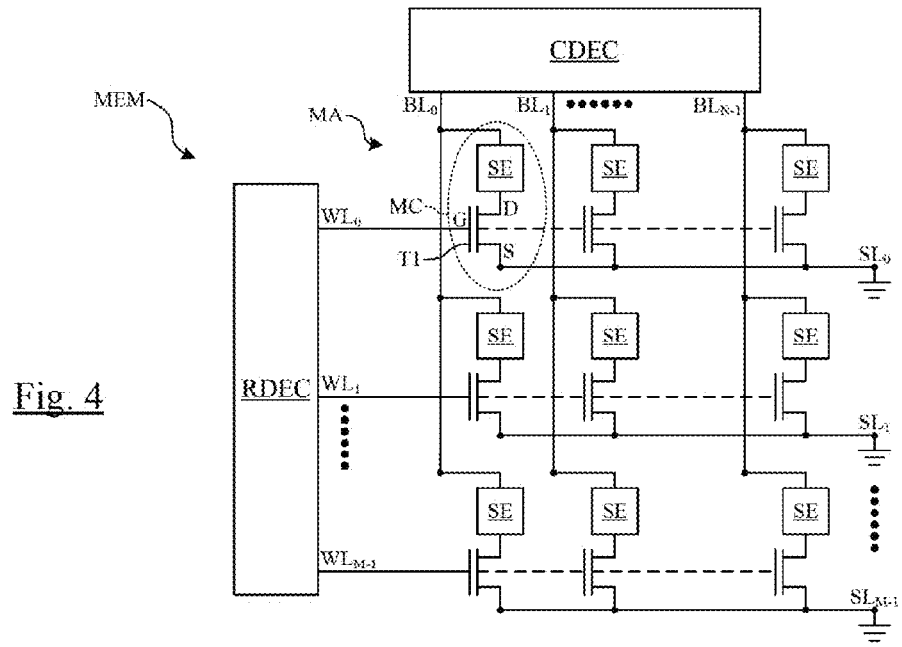
FIG. 4 shows an array of memory cells, each comprising a transistor according to one embodiment of the disclosure.

FIG. 4 shows a nonvolatile memory MEM comprising an array MA of resistive memory cells MC, M wordlines WL$_m$ (WL$_0$ to WL$_{M-1}$), M source lines SL$_m$ (SL$_0$ to SL$_{M-1}$), N bitlines BL$_n$ (BL$_0$ to BL$_{N-1}$), a row decoder RDEC, and a column decoder CDEC. The array MA comprises M×N memory cells MC arranged in rows and columns. Each memory cell MC is coupled to the row decoder RDEC by one wordline WL$_m$ and to the column decoder CDEC by one bitline BL$_n$. Each memory cell MC comprises a data storage element SE and a selection transistor T1. Transistor T1 comprises a control terminal G coupled to the wordline WL$_m$, a first conduction terminal CT (S) coupled to ground by means of a source line SL$_m$, and a second conduction terminal CT' (D) coupled to a first terminal of the corresponding storage element SE. The storage element has a second terminal coupled to the bitline BL$_n$.

Figures 5A, 5B:
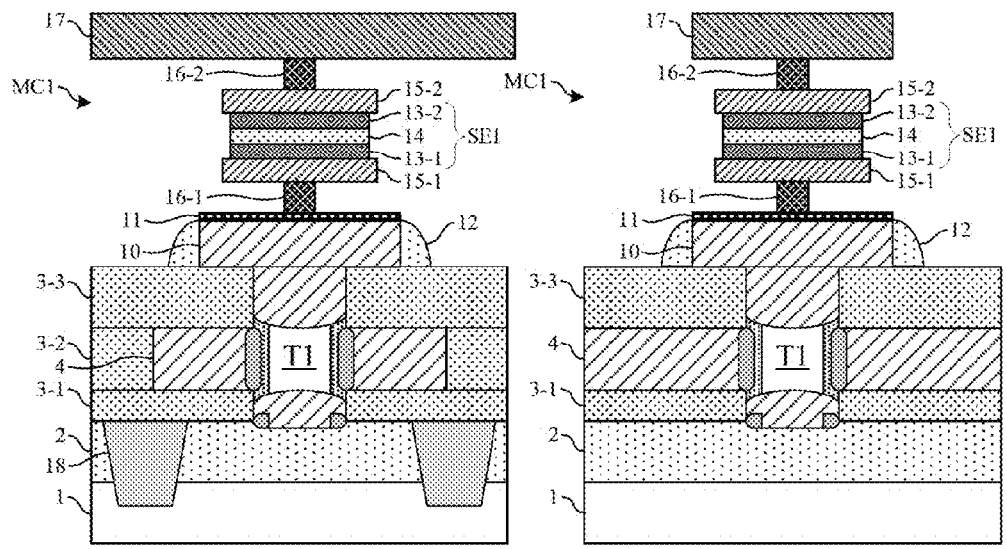
FIGS. 5A and 5B are cross-sectional views along perpendicular axes of a memory cell according to one embodiment of the disclosure.

FIGS. 5A and 5B are cross-sectional views along perpendicular axes of a memory cell MC1 comprising a transistor T1 according to an embodiment of the disclosure. The view shown in FIG. 5A traverses a wordline WL$_m$, whereas the view shown in FIG. 5B is along the direction of the wordline WL$_m$. For the sake of clarity, not all of the references of the transistor T1 are shown in FIGS. 5A, 5B.

The memory cell MC1 comprises the transistor T1 and a resistive storage element SE1. The transistor T1 comprises a salicide 11 formed on the top surface of the semiconductor material 10, and spacers 12 on the etched edges of the semiconductor material 10.

The resistive storage element SE1 comprises a bottom electrode 13-1, a top electrode 13-2, and a resistive material 14 between the electrodes. The bottom electrode 13-1 is coupled by means of a supporting bottom plate 15-1 and a lower contact 16-1 to the conduction terminal CT' of the transistor T1. The top electrode 13-2 is coupled by means of a top plate 15-2 and a top contact 16-2 to a conductive path 17. Each of the elements 13-1, 13-2, 14, 15-1, 15-2, 16-1, 16-2, 17 is formed in one or more dielectric layers, not shown for the sake of clarity.

The conductive layer 4 serves as a wordline WL$_m$, linking adjacent memory cells. The doped region 2 is coupled to the first conduction terminal CT of the transistor T1 and may serve as either a source line SL$_m$ or a bitline BL$_n$ as such a memory cell generally has a symmetric operation.

In one embodiment, the doped region 2 forms a source line and is grounded. Shallow trench isolations (STI) 18 are optionally formed in the semiconductor substrate 1 to separate adjacent pages of memory cells. The conductive path 17 forms a bitline. However, such resistive memory cells are generally symmetric in operation, such that the designation of "source line" and "bitline" may be switched. Thus, in one embodiment, the doped region 2 forms a bitline, and shallow trench isolations are provided to separate adjacent bitlines. The conductive path 17 thus forms a source line and is grounded.

Figures 6A, 6B:
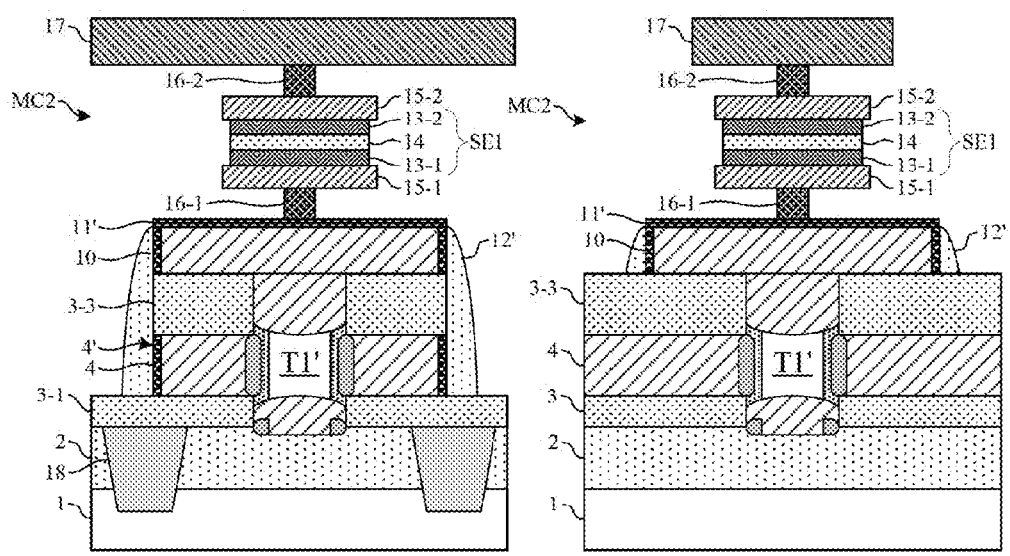
FIGS. 6A and 6B are cross-sectional views along perpendicular axes of a memory cell according to another embodiment of the disclosure.

FIGS. 6A and 6B are cross-sectional views along perpendicular axes of a memory cell MC2 according to another embodiment of the disclosure. The view shown in FIG. 6A traverses a wordline WL$_m$, whereas the view shown in FIG. 6B is along the direction of the wordline WL$_m$.

The memory cell MC2 comprises a transistor T1' and the resistive storage element SE1 as previously described in relation with FIGS. 5A, 5B. Transistor T1' only differs from transistor T1 in that, instead of the outer lateral edges 4' of the conductive layer being etched before the deposition of the third dielectric layer 3-3, as shown in FIG. 1A, the dielectric layer 3-3, conductive layer 4, and the semiconductor material 10 are etched at the same time, for example after step S8 shown in FIG. 2F. A salicide 11' is formed on the outer lateral edges 4' of the conductive layer 4 and the top surface and the outer lateral edges of the conductive terminal 10. Spacers 12' are then formed on the edges of the conductive terminal 10, the dielectric layer 3-3, and the conductive layer 4.

FIG. 7 schematically shows a device DV comprising an integrated circuit IC. The integrated circuit comprises a transistor T1, T1', T2 according to the disclosure. The transistor may belong to an array of memory cells forming a memory, which may be used both to store code (in particular application programs) and application data. The device DV may be a contactless chip card, a tag, a mobile phone, a Personal Digital Assistant, etc., and may further comprise a contactless communication interface circuit to which the memory is connected. The interface circuit may be an NFC interface circuit (Near Field Communication) connected to an antenna coil, configured to exchange data by inductive coupling and load modulation. The device DV may be configured to communicate with an external device such as a contactless card or tag reader, a POS (Point of Sale), another NFC mobile phone, etc.

It will be apparent to the skilled person that the disclosure is susceptible to various other embodiments and applications.

In one embodiment of the disclosure, a memory cell comprises a transistor T1 or T1' as the selection transistor and one or more transistors T2 as the data storage element, stacked on top of each other. In another embodiment of the disclosure, a memory cell comprises a conventional transistor, such as a planar transistor, as the selection transistor and one or more transistors T2 as the data storage element.

In one embodiment of a resistive memory cell, the resistive storage element SE1 is formed directly on the conductive material 10, without the salicide layer 11, 11', the supporting bottom plate 15-1, and the lower contact 16-1 intervening.

In some embodiments, the memory MEM may be other than a resistive memory (RRAM) or charge storage memory (EEPROM), such as a phase change memory (PCRAM), magnetic memory (MRAM), ferromagnetic memory (FRAM), static memory (SRAM), dynamic memory (DRAM), and the like.

Furthermore, while the transistors T1, T1' have been described in relation with data storage elements to form memory cells, it will be understood by the skilled person that the transistors may be used by themselves (i.e., without a data storage element), for other applications.

It will further be understood that the thicknesses of each layer 3-1, 3-2, 3-3, 4, and the width of the hole 5 are selected, depending on the fabrication process, the desired properties of the transistor, and any diffusion and/or implantation processes implemented. As a numerical example, the first dielectric layer 3-1 has a thickness between 10 and 50 nm, the conductive layer 4 and dielectric layer 3-2 have a thickness between 50 and 250 nm, and the third layer 3-3 has a thickness between 50 and 100 nm. It is within the purview of the skilled person to select the doping concentrations, implantation depths, diffusion temperature and time, etc., to obtain the desired transistor properties.

Furthermore, the methods of fabricating the transistor may be carried out in different manners, as will be apparent to the skilled person. In one embodiment, rather than depositing a semiconductor material 10 in the etched hole, the semiconductor material is grown by means of epitaxial growth. In this case, the semiconductor material is doped with the first or second conductivity type dopants during its growth.

Alternative methods of forming the dielectric layers may also be performed. For example, instead of forming the first dielectric layer 3-1 by means of a TEOS process, a High Temperature Oxide (HTO) may be implemented. Likewise, instead of using a TEOS capping process to form the third dielectric layer 3-3, a hard mask process may be implemented. In one embodiment, rather than having two separate dielectric layers 3-2 and 3-3, a single dielectric layer is deposited over the conductive layer 4.

In one embodiment, after the deposition of the semiconductor material 10, a dry etch is performed to remove the semiconductor material extending above the top surface of the dielectric layer 3-3. The semiconductor material 10 in the hole 5 remains.

It will further be understood that the hole 5 is not necessarily circular. It may take any other form, such as a square or a polygon, obtainable by conventional semiconductor fabrication methods.

In one embodiment, instead of forming the doped region 2 before depositing the first dielectric layer 3-1, the area of the substrate 1 underlying the hole 5 is locally implanted after the hole 5 has been etched. In one embodiment, instead of forming the transistor T1, T1', T2 directly above the semiconductor substrate 1, such that an etched hole exposes the top surface of the substrate, the transistor is formed above another semiconductor surface, such as a deposited crystalline semiconductor material forming a conductive path or conduction terminal.

In some embodiments, the dielectric layers 3-1, 3-3 are not etched in the same step as the etching of the inner lateral edge 4" of the conductive layer 4. That is to say, the first dielectric layer 3-1 is deposited, etched, and filled with an N-conductivity type doped semiconductor material forming a first conduction terminal. The conductive layer 4 is then deposited, covering the first dielectric layer 3-1 and the conduction terminal, and a hole is etched until the top surface of the first conduction terminal is reached. The oxidation is then performed, forming a gate oxide on the inner lateral edges of the conductive layer and on the top surface of the semiconductor material forming the conduction terminal. The etch protection sidewall 9 and the semiconductor material 10 are then deposited as previously described, and are doped or implanted with P-conductivity type dopants to form the channel CH. The third dielectric layer 3-3 is then deposited above the conductive layer 4 and the channel, and likewise etched and filled with an N-conductivity type doped semiconductor material to form the second conduction terminal CT'. Consequently, the etch-protection sidewall 9 does not necessarily cover the edges of the dielectric layer(s) 3-1, 3-3.

Finally, the skilled person may choose suitable materials for the fabrication of the transistors and memory cells according to the disclosure. The substrate 1 may be silicon, gallium arsenide, germanium, germanium silicon, silicon-on-insulator, or other similar substrate materials. The dielectric layers 3 may be silicon dioxide (SiO2), nitride, oxide-nitride-oxide (ONO), boro-silicate-glass (BSG), boro-phosphate-silicate glass (BPSG), phosphate-silicate-glass (PSG), or other similar dielectric materials.

The semiconductor material 10 can be an amorphous semiconductor material, a polycrystalline semiconductor material, or a crystalline (i.e., mono-crystalline) semiconductor material. In the case of polycrystalline or amorphous material, it may crystallize by a crystallization process after deposition, depending on interface effects, such as with the semiconductor substrate, and the temperature and time profile.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
providing a semiconductor substrate having a semiconductor surface;
forming a vertical MOS transistor over the semiconductor surface of the semiconductor substrate, the forming of the vertical MOS transistor structure including:
forming, above the semiconductor surface, a dielectric layer and a conductive layer in the dielectric layer;
etching a hole through the conductive layer, the hole exposing an inner lateral edge of the conductive layer and a portion of the semiconductor surface;
forming a gate dielectric on the inner lateral edge of the conductive layer and a bottom dielectric on the portion of the semiconductor surface;
forming an etch-protection semiconductor sidewall on a lateral edge of the hole, the etch-protection semiconductor sidewall covering the gate dielectric and an outer region of the bottom dielectric, leaving an inner region of the bottom dielectric exposed;
doping the etch-protection semiconductor sidewall with dopants of a second conductivity type;
etching the exposed inner region of the bottom dielectric until the semiconductor surface is reached; and
depositing a semiconductor material in the hole.

2. The method according to claim 1 further comprising forming, in the semiconductor surface, a doped region including dopants of a first conductivity type.

3. The method according to claim 2 further comprising forming a conduction terminal of the transistor by diffusing dopants from the doped region into the semiconductor material in the hole.

4. The method according to claim 1, wherein the first conductivity type is P-type and the second conductivity type is N-type.

5. The method according to claim 1, wherein forming the etch-protection semiconductor sidewall on the lateral edge of the hole comprises depositing through chemical vapor deposition a layer of polysilicon.

6. The method according to claim 1 further comprising:
implanting dopants into a top surface of the semiconductor material; and
diffusing dopants in the top surface of the semiconductor material into the hole to form a conduction terminal of the transistor.

7. The method according to claim 1 further comprising, after forming the gate dielectric:
forming a charge storage layer covering the gate dielectric; and
forming a tunnel dielectric layer covering the charge storage layer.

8. A method, comprising:
providing a semiconductor substrate having a surface, the semiconductor substrate having a first conductivity type;
forming a dielectric layer above the surface of the semiconductor substrate;
forming a conductive layer in the dielectric layer;
forming a hole through the conductive layer, the hole exposing through a sidewall surface of the hole an inner lateral edge of the conductive layer, and the hole exposing through a bottom surface a portion of the surface of the semiconductor substrate;
forming a gate dielectric on the inner lateral edge of the conductive layer and a bottom dielectric on the exposed portion of the surface of the semiconductor substrate;
forming a protection sidewall on the sidewall surface of the hole, the protection sidewall covering the gate dielectric and the protection sidewall also covering an outer portion of the bottom dielectric, the protection sidewall leaving an inner portion of the bottom dielectric exposed;
removing the exposed inner portion of the bottom dielectric to expose the portion of the surface of the semiconductor substrate;
forming a semiconductor material in the hole, the semiconductor material having the first conductivity type;
forming a doped region including dopants of a second conductivity type in the semiconductor substrate; and
diffusing dopants from the doped region into the semiconductor material in the hole to form through this diffusion of dopants a first conduction terminal of the transistor.

9. The method of claim 8, wherein forming the hole through the conductive layer comprises etching the hole through the conductive layer.

10. The method of claim 8, wherein removing the exposed inner portion of the bottom dielectric comprises etching the exposed inner portion of the bottom dielectric.

11. The method of claim 8, wherein forming the semiconductor material in the hole comprises depositing doped polycrystalline silicon in the hole.

12. The method of claim 8, wherein forming the protection sidewall on the sidewall surface of the hole comprises:
forming a semiconductor protection sidewall on the sidewall surface of the hole; and
doping the semiconductor protection sidewall with dopants of the first conductivity type.

13. The method according to claim 12, further comprising:
implanting dopants of the second conductivity type into an upper surface of the semiconductor material; and
diffusing the dopants implanted into the upper surface of the semiconductor material into the hole to form a second conduction terminal of the transistor.

14. The method according to claim 1 further comprising:
after forming the gate dielectric,
forming a charge storage layer covering the gate dielectric;
forming a tunnel dielectric layer covering the charge storage layer; and
wherein forming the protection sidewall on the sidewall surface of the hole includes forming the protection sidewall on the tunnel dielectric layer, the protection sidewall covering the tunnel dielectric layer and the charge storage layer, tunnel dielectric layer, and protection sidewall covering an outer portion of the bottom dielectric while leaving an inner portion of the bottom dielectric exposed.

15. A method of forming a vertical MOS transistor, comprising:
forming a doped region including dopants of a first conductivity type in a semiconductor substrate;
forming a dielectric layer above a surface of the semiconductor substrate;
forming a conductive layer in the dielectric layer;
forming a hole through the conductive layer, the hole exposing through a sidewall surface of the hole an inner lateral edge of the conductive layer, and the hole exposing through a bottom surface of the hole a portion of the surface of the semiconductor substrate;
forming a gate dielectric on the inner lateral edge of the conductive layer and a bottom dielectric on the exposed portion of the surface of the semiconductor substrate;
forming a protection sidewall on the sidewall surface of the hole, the protection sidewall covering the gate dielectric and the protection sidewall also covering an outer portion of the bottom dielectric, the protection sidewall leaving an inner portion of the bottom dielectric exposed;
removing the exposed inner portion of the bottom dielectric to expose the portion of the surface of the semiconductor substrate;
forming a semiconductor material in the hole;
diffusing dopants from the doped region into the semiconductor material in the hole to form, through this diffusion of dopants from the doped region, a first conduction terminal;
implanting dopants of the first conductivity type into an upper surface of the semiconductor material; and
diffusing dopants in the upper surface of the semiconductor material into the hole to form, through this diffusion of dopants from the upper surface of the semiconductor material, a second conduction terminal, wherein a portion of the semiconductor material between the first and second conduction terminals forms a channel region of the vertical MOS transistor.

16. The method of forming a vertical MOS transistor of claim 15, wherein forming the protection sidewall on the sidewall surface of the hole comprises:

forming a semiconductor protection sidewall on the sidewall surface of the hole; and doping the semiconductor protection sidewall with dopants of a second conductivity type.

17. The method of forming a vertical MOS transistor of claim 15 further comprising:

after forming the gate dielectric,
- forming a charge storage layer covering the gate dielectric;
- forming a tunnel dielectric layer covering the charge storage layer; and
- wherein forming the protection sidewall on the sidewall surface of the hole includes forming the protection sidewall on the tunnel dielectric layer, the protection sidewall covering the tunnel dielectric layer and the charge storage layer, tunnel dielectric layer, and protection sidewall covering an outer portion of the bottom dielectric while leaving an inner portion of the bottom dielectric exposed.

\* \* \* \* \*